(12) United States Patent
Broemse et al.

(10) Patent No.: US 10,583,576 B2
(45) Date of Patent: Mar. 10, 2020

(54) HEATING ELEMENT FOR A SHAVING RAZOR

(71) Applicant: The Gillette Company, Boston, MA (US)

(72) Inventors: Norbert Broemse, Bad Homberg (DE); Klaus Heubach, Koenigsteon (DE)

(73) Assignee: The Gillette Company LLC, Boston, MA (US)

(*) Notice: Subject to any disclaimer, the term of this patent is extended or adjusted under 35 U.S.C. 154(b) by 741 days.

(21) Appl. No.: 15/171,020

(22) Filed: Jun. 2, 2016

(65) Prior Publication Data

US 2016/0375597 A1 Dec. 29, 2016

(30) Foreign Application Priority Data

Jun. 25, 2015 (EP) .................................... 15173954

(51) Int. Cl.
*B26B 21/48* (2006.01)
*B26B 21/40* (2006.01)
(Continued)

(52) U.S. Cl.
CPC .............. *B26B 21/48* (2013.01); *B26B 21/06* (2013.01); *B26B 21/225* (2013.01);
(Continued)

(58) Field of Classification Search
CPC ....... B26B 21/48; B26B 21/405; B26B 21/06; B26B 21/225; B26B 21/227; B26B 21/443; B26B 21/526; B26B 21/50; B26B 21/4056; B26B 19/38; B26B 19/388; B26B 19/3873; H05B 3/0014; H05B 3/12; H05B 3/363; H05K 1/0212; H05K 1/111; H05K 1/147; H05K 1/189; H05K 1/11; H05K 1/14; H05K 1/118; H05K 1/148; H05K 1/184; H05K 1/185; H05K 2201/09063;
(Continued)

(56) References Cited

U.S. PATENT DOCUMENTS

2003/0226258 A1 12/2003 Patrick
2010/0031510 A1* 2/2010 Gester .................... B26B 21/48
30/34.05

(Continued)

FOREIGN PATENT DOCUMENTS

| JP | H06216532 A | 8/1994 |
|----|-------------|--------|
| JP | H11059591 | 3/1999 |
| JP | 2008059842 A | 3/2008 |

OTHER PUBLICATIONS

EPO Search Report with Written Opinion in corresponding EPO application 15173954.7 dated Dec. 15, 2015.

*Primary Examiner* — Shawntina T Fuqua
(74) *Attorney, Agent, or Firm* — John M. Lipchitz

(57) ABSTRACT

A heating element for a shaving razor having an insulating member with a base and at least one electrical terminal. A flexible printed circuit board having a base with at least one electrical terminal electrically and mechanically coupled to the corresponding electrical terminal of the insulating member. A non electrically conductive underfiller encapsulant is positioned between the base of the insulating member and the base of the flexible printed circuit board to provide a water tight seal around the electrical terminals.

20 Claims, 4 Drawing Sheets

(51) Int. Cl.
    *B26B 21/06*   (2006.01)
    *B26B 21/22*   (2006.01)
    *B26B 21/44*   (2006.01)
    *H05B 3/00*    (2006.01)
    *H05B 3/12*    (2006.01)
    H05K 3/36      (2006.01)
    H05K 1/14      (2006.01)
    H05K 1/02      (2006.01)
    H05K 1/18      (2006.01)
    H05K 1/11      (2006.01)
(52) U.S. Cl.
    CPC .......... *B26B 21/227* (2013.01); *B26B 21/405* (2013.01); *B26B 21/443* (2013.01); *H05B 3/0014* (2013.01); *H05B 3/12* (2013.01); *H05K 1/0212* (2013.01); *H05K 1/111* (2013.01); *H05K 1/147* (2013.01); *H05K 1/189* (2013.01); *H05K 3/363* (2013.01); *H05K 2201/05* (2013.01); *H05K 2201/09063* (2013.01)

(58) Field of Classification Search
    CPC ..... H05K 2201/09072; H05K 2201/95; H05K 2201/09563; H05K 2201/09572; H25K 1/09036
    See application file for complete search history.

(56) References Cited

U.S. PATENT DOCUMENTS

| | | |
|---|---|---|
| 2010/0212939 A1 | 8/2010 | Ito et al. |
| 2014/0048310 A1 | 2/2014 | Montevirgen et al. |
| 2015/0296622 A1* | 10/2015 | Jiang ..................... G01L 1/2268 361/750 |

* cited by examiner

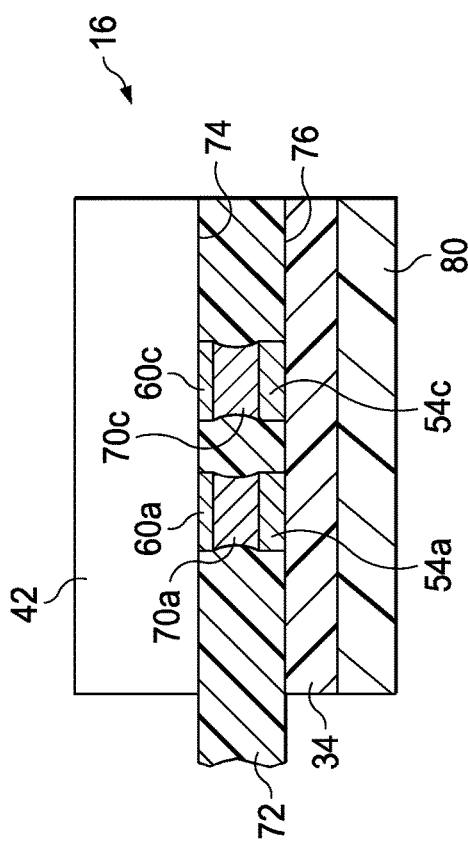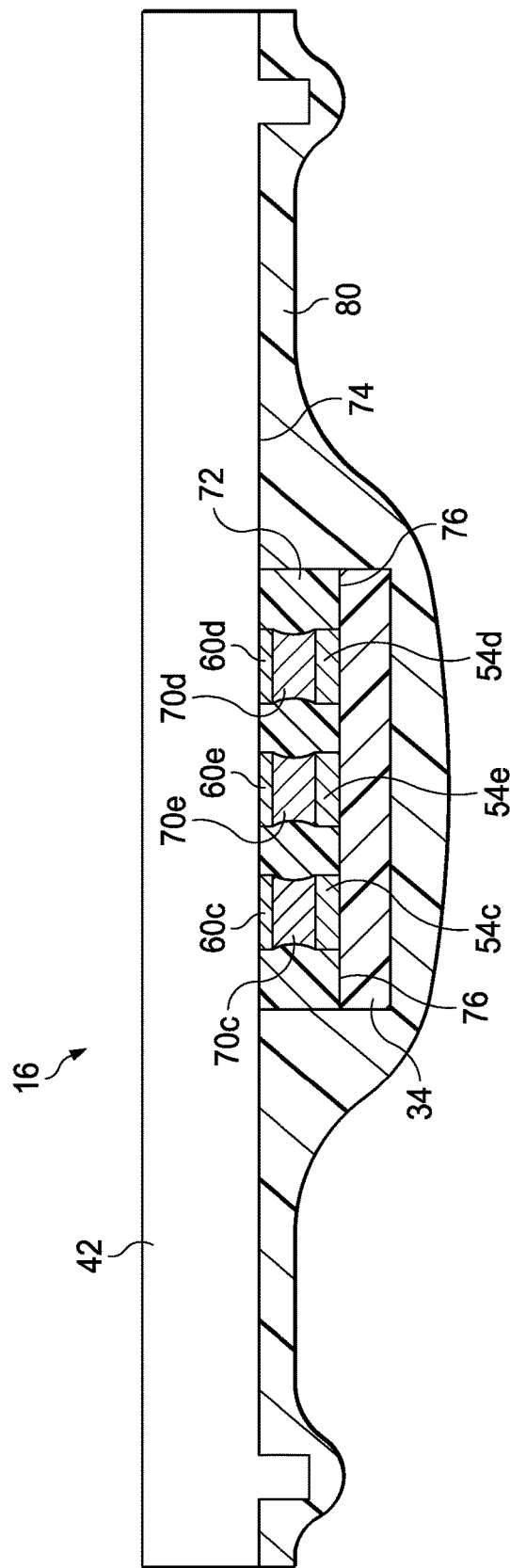

HEATING ELEMENT FOR A SHAVING RAZOR

FIELD OF THE INVENTION

The present invention relates to personal care products and more particularly to heated razors for wet shaving.

BACKGROUND OF THE INVENTION

Users of wet-shave razors generally appreciate a feeling of warmth against their skin during shaving. The warmth feels good, resulting in a more comfortable shaving experience. Various attempts have been made to provide a warm feeling during shaving. For example, shaving creams have been formulated to react exothermically upon release from the shaving canister, so that the shaving cream imparts warmth to the skin. Also, various ways of delivering heat through the razor cartridge have also been proposed in the patent literature. It has also been proposed in the patent literature to heat the blades, which may decrease the force required to cut the hair. Additional electronic components may be required to deliver heat to the skin in a safe and reliable manner. Furthermore, electronic components must be small to fit within a consumer appliance, such as a razor. Accordingly, electrical components and fittings are typically very delicate and can break easily. In order to provide a safe and functional cartridge capable of delivering heat to the skin, the electrical components of the heating member must be sealed against water ingress in a reliable cost effective manner.

Accordingly, there is a need to prevent water ingress into the electronics of a heating element of a consumer appliance, while also providing support and/or strain relief for the electrical connections.

SUMMARY OF THE INVENTION

The invention features, in general, a simple, efficient heating element for a shaving razor having an insulating member with a base and at least one electrical terminal. A flexible printed circuit board having a base with at least one electrical terminal is electrically and mechanically coupled to the electrical terminal of the insulating member. A non electrically conductive underfiller encapsulant is positioned between the base of the insulating member and the base of the flexible printed circuit board to provide a water tight seal around the electrical terminals.

The invention also features, in general, a simple, efficient assembly for a personal care product with a base and at least one electrical terminal. A flexible printed circuit board having a base with at least one electrical terminal is electrically and mechanically coupled to the electrical terminal of the other base. A non electrically conductive underfiller encapsulant is positioned between the bases to provide a water tight seal around the electrical terminals.

The details of one or more embodiments of the invention are set forth in the accompanying drawings and the description below. It is understood that certain embodiments may combine elements or components of the invention, which are disclosed in general, but not expressly exemplified or claimed in combination, unless otherwise stated herein. Other features and advantages of the invention will be apparent from the description and drawings, and from the claims.

BRIEF DESCRIPTION OF THE DRAWINGS

While the specification concludes with claims particularly pointing out and distinctly claiming the subject matter that is regarded as the present invention, it is believed that the invention will be more fully understood from the following description taken in conjunction with the accompanying drawings.

FIG. 4 is a cross section view of the heating element, taken generally along the line 4-4 of FIG. 3.

FIG. 5 is a cross section view of the heating element, taken generally along the line 5-5 of FIG. 3.

DETAILED DESCRIPTION OF THE INVENTION

Figure 1:
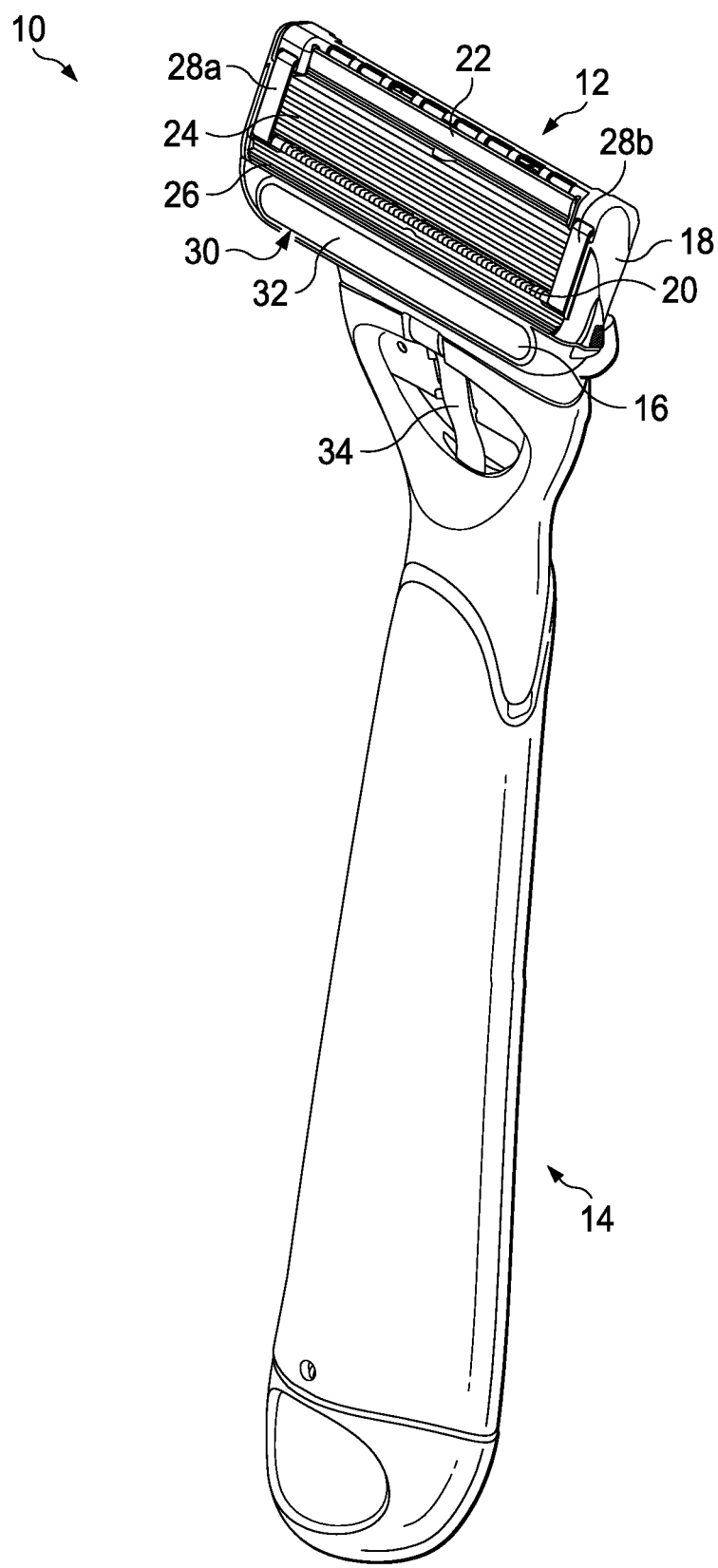
FIG. 1 is a perspective view of one possible embodiment of a shaving razor system.

Referring to FIG. 1, one possible embodiment of the present disclosure is shown illustrating a shaving razor system 10. In certain embodiments, the shaving razor system 10 may include a shaving razor cartridge 12 mounted to a handle 14. The shaving razor cartridge 12 may be fixedly or pivotably mounted to the handle 14, depending on the overall desired cost and performance of the shaving razor system 10. The handle 14 may hold a power source, such as one or more batteries (not shown) that supply power to a heating element 16. In certain embodiments, the heating element 16 may comprise a metal, such as aluminum or steel. It is understood that the shaving razor system 10 may also include other electronic personal care products, such as toothbrushes, electric razors, or other products that are used in a wet environment.

The shaving razor cartridge 12 may be permanently attached or removably mounted from the handle 14, thus allowing the shaving razor cartridge 12 to be replaced. The shaving razor cartridge 12 may have a housing 18 with a guard 20, a cap 22, and one or more blades 24 mounted to the housing 18 between the cap 22 and the guard 20. The guard 20 may be toward a front portion of the housing 18 and the cap 22 may be toward a rear portion of the housing 18 (i.e., the guard 20 is in front of the blades 24 and the cap is behind the blades 24). The guard 20 and the cap 22 may define a shaving plane that is tangent to the guard 20 and the cap 22. The guard 20 may be a solid or segmented bar that extends generally parallel to the blades 24. In certain embodiments, the guard 20 may comprise a skin-engaging member 26 (e.g., a plurality of fins) in front of the blades 24 for stretching the skin during a shaving stroke. The skin-engaging member 26 may be insert injection molded or co-injection molded to the housing 18. However, other known assembly methods may also be used such as adhesives, ultrasonic welding, or mechanical fasteners. The skin engaging member 26 may be molded from a softer material (i.e., lower durometer hardness) than the housing 18. For example, the skin engaging member 26 may have a Shore A hardness of about 20, 30, or 40 to about 50, 60, or 70. A softer material may enhance skin stretching, as well as provide a more pleasant tactile feel against the skin of the user during shaving. A softer material may also aid in masking the less pleasant feel of the harder material of the housing 18 and/or the fins against the skin of the user during shaving.

In certain embodiments, the blades 24 may be mounted to the housing 18 and secured by one or more clips 28a and 28b. Other assembly methods known to those skilled in the art may also be used to secure and/or mount the blades 24 to the housing 18 including, but not limited to, wire wrapping, cold forming, hot staking, insert molding, ultrasonic welding, and adhesives. The clips 28a and 28b may comprise a metal, such as aluminum for acting as a sacrificial anode to help prevent corrosion of the blades 24. Although five blades 24 are shown, the housing 18 may have more or fewer blades depending on the desired performance and cost of the shaving razor cartridge 12.

In certain embodiments, it may be desirable to provide heat in front of the blades 24. For example, the heating element 16 may be positioned in front of the guard 20 and/or the skin engaging member 26. The heating element 16 may comprise a skin contacting surface 30 (e.g., a face plate 32) that delivers heat to a consumer's skin during a shaving stroke for an improved shaving experience. As will be described in greater detail below, the heating element 16 may be mounted to either the shaving razor cartridge 12 or to a portion of the handle 14. The heating element 16 may be in electrical communication with a power circuit via a flexible circuit 34.

The cap 22 may be a separate molded (e.g., a shaving aid filled reservoir) or extruded component (e.g., an extruded lubrication strip) that is mounted to the housing 18. In certain embodiments, the cap 22 may be a plastic or metal bar to aid in supporting the skin and define the shaving plane. The cap 22 may be molded or extruded from the same material as the housing 18 or may be molded or extruded from a more lubricious shaving aid composite that has one or more water-leachable shaving aid materials to provide increased comfort during shaving. The shaving aid composite may comprise a water-insoluble polymer and a skin-lubricating water-soluble polymer. Suitable water-insoluble polymers which may be used include, but are not limited to, polyethylene, polypropylene, polystyrene, butadiene-styrene copolymer (e.g., medium and high impact polystyrene), polyacetal, acrylonitrile-butadiene-styrene copolymer, ethylene vinyl acetate copolymer and blends such as polypropylene/polystyrene blend, may have a high impact polystyrene (i.e., Polystyrene-butadiene), such as Mobil 4324 (Mobil Corporation).

Figure 2:
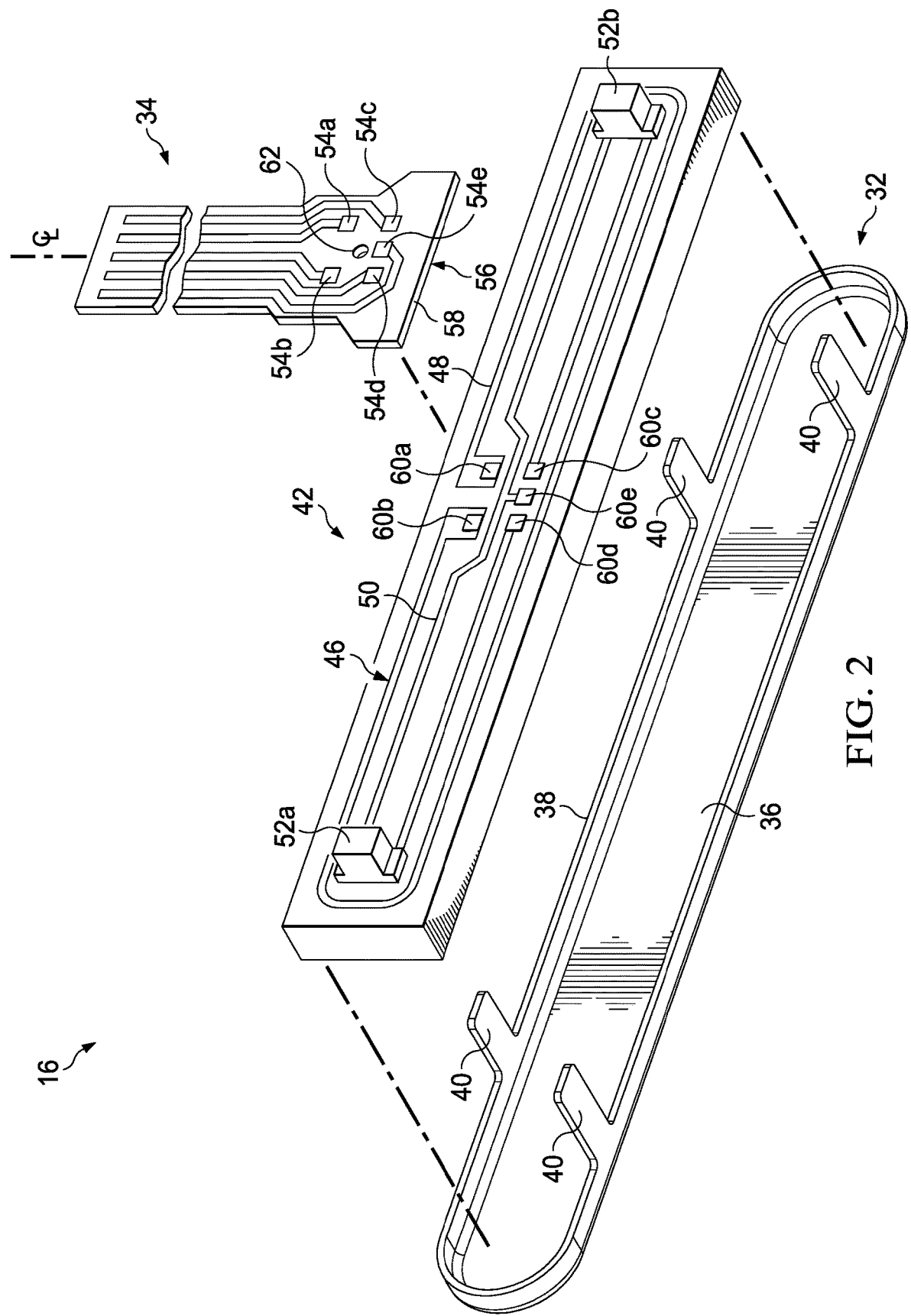
FIG. 2 is an assembly view of one possible embodiment of a heating element that may be incorporated into the shaving razor system of FIG. 1.

Referring to FIG. 2, one possible embodiment of a heating element 16 is shown that may be incorporated into the shaving razor system of FIG. 1. The heating element 16 may comprise the face plate 32, an insulating member 42, and the flexible circuit 34. In certain embodiments, the insulating member may provide an area to attach various electronic elements, including, but not limited to heating elements and/or sensors. The face plate 32 may have a bottom surface 36 opposing the skin contacting surface 30 (skin contacting surface 30 is shown in FIG. 1). A perimeter wall 38 may define the bottom surface 36. It is understood that the perimeter wall 38 may be continuous or segmented (e.g., a plurality of legs or castellations). The perimeter wall 38 may have one or more legs 40 extending from the perimeter wall 38, transverse to and away from the bottom surface 36. For example, FIG. 2 illustrates four legs 40 extending from the perimeter wall 38. The legs 40 may facilitate locating and securing the heating element 16 during the assembly process. The insulating member 42 may be mounted to the face plate 32 and then secured to the housing 18. For example, the insulating member 42 may be positioned within the perimeter wall 38 and the face plate 32 may be mechanically secured to the housing 18. If added securement is desired, the insulating member 42 may be bonded (e.g., using adhesives) to the face plate 32. In certain embodiments, the insulating member 42 may comprise a ceramic or other material having high thermal conductivity and/or excellent electrical insulator properties. The insulating member 42 may have a first surface (not shown) that faces the bottom surface 36 of the face plate 32 and a second surface 46 opposite the first surface (not shown). The first surface may contact the bottom surface 36 to transfer heat to the face plate 32. The perimeter wall 38 may help contain and locate the insulating member 42. In certain embodiments, the insulating member 42 may be secured to the bottom surface 36 by various bonding techniques generally known to those skilled in the art.

The second surface 46 of the insulating member 42 may comprise a conductive heating track 48 that extends around a perimeter of the insulating member 42. An electrical circuit track 50 may also extend around a perimeter of the second surface 46. In certain embodiments, the electrical circuit track 50 may be positioned within the perimeter of the heating track 48. The electrical circuit track 50 may be spaced apart from the heating track 48, so it does not interfere with the function of the electrical circuit track 50. The electrical circuit track 50 may comprise a pair of thermal sensors 52a and 52b that are positioned on opposite lateral ends (e.g., on left and right sides) of the second surface 46 of the insulating member 42. In certain embodiments, the thermal sensors 52a and 52b may be NTC-type thermal sensors (negative temperature coefficient). In is understood that more than one thermal sensors 52a and 52b may be used depending on the desired cost and safety requirements for the heating element 16. In addition, the thermal sensors 52a and 52b may be positioned anywhere on the insulating member 42.

The positioning of the thermal sensors 52a and 52b opposite lateral ends of the second surface 46 of the insulating member 42 may provide for a safer and more reliable measurement of the temperature of the heating element 16 (e.g., the face plate 30) and/or the insulating member 42. For example, if only one end of the heating element 16 is exposed to cool water (e.g., when the shaving razor cartridge is being rinsed in between shaving strokes), that end of the heating element will be cooler than the other end of the heating element. Lateral heat flow from one end to the opposite of heating elements may be poor and temperature equalization may be limited by the heat resistance of the mechanical heater system. Accordingly, a single sensor or multiple sensor(s) that take an average temperature may not provide an accurate reading and may over heat the heating element, which may lead to burning of the skin. Power to the heating element 16 may never turn off because of the unbalanced temperature of the heating element 16 (i.e., the average temperature or the individual temperature of the single sensor exposed to the cool water may never be reached). Accordingly, the thermal sensors 52, 52b may independently output a signal related to the temperature of the heating element 16 to the temperature control circuit, which is in electrical communication with the thermal sensors 50, 52.

Similarly, if only one end of the heating element 16 is exposed to hot water (e.g., when the shaving razor cartridge is being rinsed in between shaving strokes), that end of the heating element will be hotter than the other end of the heating element 16. Accordingly, a single sensor or multiple sensor(s) that take an average temperature will not provide an accurate reading and may result in power to the heating element being cut off or reduced prematurely (resulting in the consumer not feeling a heating sensation during shaving). The thermal sensors 52a and 52b may also be spaced apart from the heating track 48 to provide a more accurate temperature reading. For example, thermal sensors 52a and 52b may be spaced apart by about 3 mm to about 30 mm depending on the desired accuracy and manufacturing costs. In certain embodiments, a protective coating may be layered over the electrical circuit track 50 and/or the heating track 48. If desired, the entire second surface may be covered in a protective coating to provide thermal isolation and/or prevent water ingress, which may lead to a malfunction of the electrical heat control circuit (e.g., damage of the sensors 52a and 52b, the electrical circuit track 50 and/or the heating track 48).

The electrical circuit track 50 and/or the heating track 48 may be electrically coupled to the flexible printed circuit board 34. In order for the electrical circuit track 50 and/or the heating track 48 to function properly, the connections between the flexible printed circuit board 34 and the electrical circuit track 50 and/or the heating track 48 must be sealed from water ingress. The flexible printed circuit board 34 may have a plurality of spaced apart electrical terminals 54a, 54b, 54c, 54d, and 54e. It is understood the flexible printed circuit board 34 may have more or less spaced apart electrical terminals 54a, 54b, 54c, 54d, and 54e depending on the desired number of electrical circuit tracks 50 and/or heating tracks 48. For example, the electrical terminals 54a, 54b may facilitate electrical connection for the heating track and the electrical terminals 54c, 54d may facilitate electrical connection for the electrical track 50 that is connected to the sensors 52a and 52b. The electrical terminal 54e may be a ground connection to the sensors 52a, 52b. In certain embodiments, the insulating member 42 may comprise a ceramic substrate having a plurality of spaced apart electrical terminals 60a, 60b, 60c, 60d, and 60e that correspond to the spaced apart electrical terminals 54a, 54b, 54c, 54d, and 54e on the flexible printed circuit board 34. It is understood insulating member 42 may have more or less spaced apart electrical terminals 60a, 60b, 60c, 60d, and 60e depending on the desired number of electrical circuit tracks 50 and/or heating tracks 48. For example, the electrical terminals 60a and 60b may facilitate electrical connection for the heating track 48 and the electrical terminals 60c and 60d may facilitate electrical connection for the electrical track 50 that is connected to the sensors 52a and 52b. The electrical terminal 60e may be a ground connection to the sensors 52a and 52b.

The flexible printed circuit board 34 may have a bounded opening 62 extending completely through the flexible printed circuit board 34. The bounded opening 62 may be dimensioned to receive an underfiller encapsulant that is not electrically conductive to provide a water tight seal. For example, the bounded opening may have a diameter of about 0.5 mm to about 2.5 mm. In certain embodiments, the bounded opening 62 may be positioned between two or more of the spaced apart electrical terminals 54a, 54b, 54c, 54d, and 54e. For example, FIG. 2 illustrates the bounded opening 62 between the electrical terminals 54a and 54b. The bounded opening 62 may be spaced apart from the electrical terminals 54a, 54b, 54c, 54d and 54e by about 0.1 mm, 0.2 mm or 0.3 mm to about 0.4 mm, 0.5 mm or 0.6 mm. The distance between the bounded opening 62 and the electrical terminals 54a, 54b, 54c, 54d and 54e may be substantially the same (e.g., within 10% of each other) to allow a similar flow path for the underfiller encapsulant. For example, if a difference in the distance between the bounded opening 62 and each of the electrical terminals 54a, 54b, 54c, 54d and 54e is too great, some of the electrical terminals 54a, 54b, 54c, 54d and 54e may not be sealed efficiently during assembly.

The flexible printed circuit board 34 may have a slot 56 that extends into the circuit board from an edge 58. As will be explained in greater detail below, the slot 56 may cut completely through the flexible printed circuit board 34 to facilitate an underfiller encapsulant that is non electrically conductive to provide a water tight seal. The slot 56 may be positioned along a center line "CL" of the flexible printed circuit board 34 to facilitate proper filling of the encapsulant. The slot 56 may be used instead of or in addition to the opening 62. The slot 56 may provide a larger possible area to fill in to for faster and more complete sealing. For example, the slot 56 may have a width "$w_1$" of about 0.5 mm to about 5 mm and a depth "$d_1$" of about 0.5 mm to about 5 mm.

Figure 3:
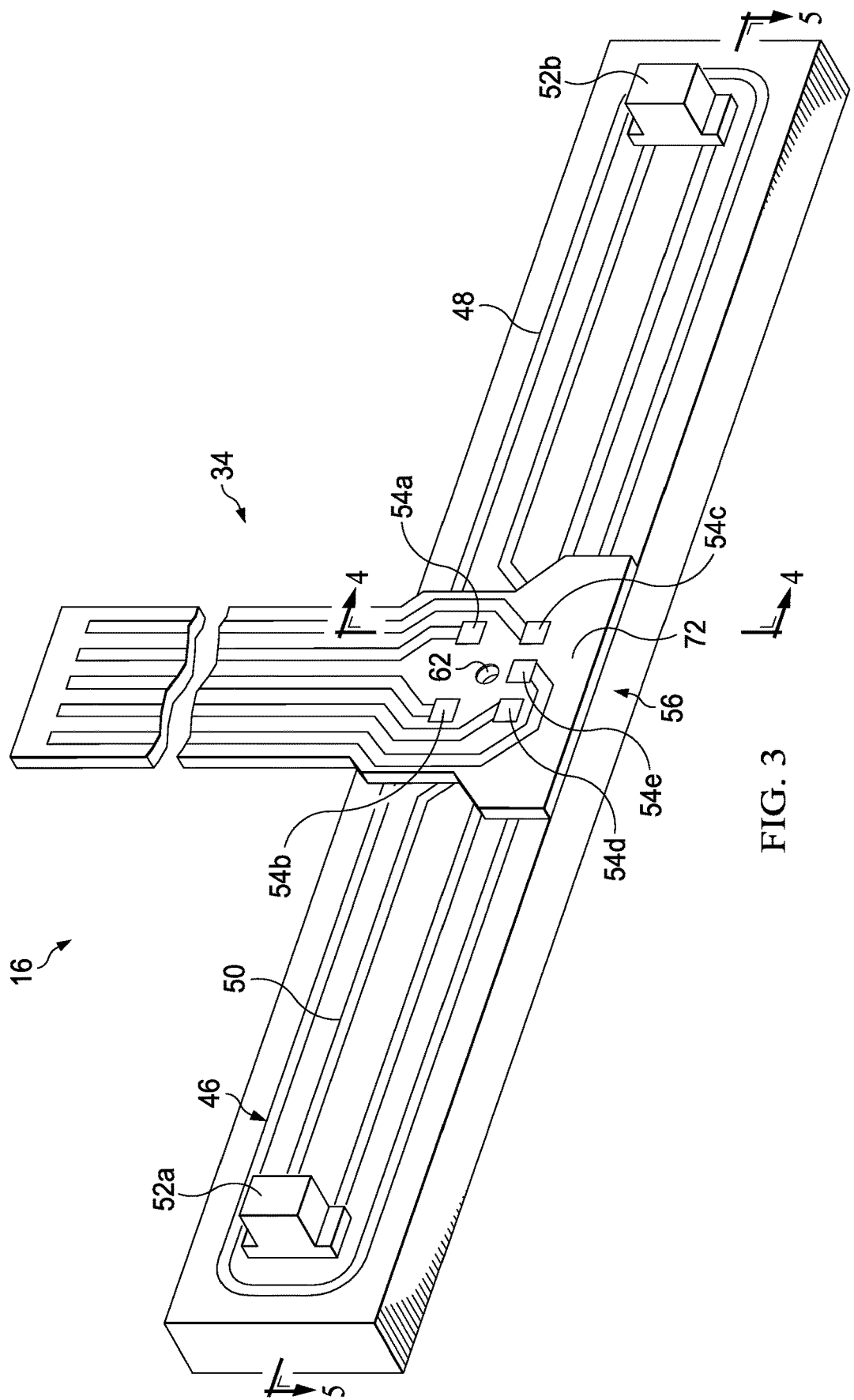
FIG. 3 is a perspective view of a portion of the heating element of FIG. 2.

Referring to FIG. 3, a perspective view of the heating element 16 is shown with the flexible circuit 34 connected to the insulating member 42. The flexible circuit 34 may be placed over the insulating member 42 such that the electrical terminals 54a, 54b, 54c, 54d, and 54e of the flexible circuit 34 generally align with the electrical terminals 60a, 60b, 60c, 60d, and 60e on the insulating member. The underfiller encapsulant 72 may be applied through the opening 62 and/or the slot 56. If the slot 56 is utilized for the underfiller encapsulant, then the opening 62 may be able to be used as a locating hole to aid with alignment of the flexible circuit board 34 and the insulating member 42 instead of receiving the underfiller encapsulant 72. A locating hole may be advantageous because space is limited on the flexible circuit board 32 and the terminals 54a, 54b, 54c, 54d, and 54e must be aligned correctly with the corresponding terminals 60a, 60b, 60c, 60d, and 60e. The opening 62 may also be useful to help control any overflow of the underfiller encapsulant 72. Alternatively, the underfiller encapsulant 72 may be inserted between the flexible circuit 34 and the insulating member 42 from the edge 58 of the printed circuit board 34. For example, the underfiller encapsulant 72 may extend up to the edge 58 after filling is complete.

FIG. 4 illustrates a cross section view of the heating element 16, taken generally along the line 4-4 of FIG. 3. A solder pad joint 70a may be positioned between the electrical terminal 54a on the flexible circuit 34 and the electrical terminal 60a on the insulating member 42. Similarly, a solder pad joint 70b positioned between the electrical terminal 54b on the flexible circuit 34 and the electrical terminal 60b on the insulating member 42. As shown in FIG. 5, the heating element 16 may also comprise a plurality of solder pads 70c, 70d and 70e positioned between the electrical terminals 54c, 54d, and 54e of the flexible circuit 34 and the corresponding electrical terminals 60c, 60d and 60e on the insulating member 42. The solder pad joints 70a, 70b, 70c, 70d, and 70e may facilitate a mechanical and/or electrical coupling between the insulating member 42 and the flexible circuit 34.

As shown in FIGS. 4 and 5, the electrical terminals 60a, 60b, 60c, 60d, and 60e may extend from a base 74 of the insulating member 42. The electrical terminals 54a, 54b, 54c, 54d, and 54e may extend from a base 76 of the flexible circuit 34. The base 74 of the insulating member 42 may be spaced apart about 10 μm to about 300 μm and more preferably about 30 μm to about 60 μm from the base 76 of the flexible circuit 34 to provide sufficient spacing (e.g., a gap) for the underfiller encapsulant 72 to flow during assembly. The underfiller encapsulant 72 may bond to the printed circuit board 34 and/or the insulating member 42. The thickness of underfiller encapsulant 72 (e.g., the distance between the base 76 and the base 74) and the adhesion of underfiller encapsulant 72 to the printed circuit board 34 and/or the insulating member 42 may provide sufficient strain relief for the connection between the corresponding electrical terminals 54a, 54b, 54c, 54d, 54e, 60a, 60b, 60c, 60d, and 60e. The added strain relief results in a safer, more robust assembly with a longer product life span and a lower risk of failure. In certain embodiments, a non-metallic coating 80 may be added over the flexible printed circuit board 34, the insulating member (e.g., the heating track 48 and the electrical track 50), and/or the sensors 52a and 52b. The non-metallic coating 80 may facilitate protection of the sensors 52a and 52b as well as the heating track 48 and electrical track 50 shown in FIG. 2. For example, the non-metallic coating 80 may be applied to the second surface 46 of the insulating member 42 either before or after the flexible circuit board 34 is connected and/or secured to the insulating member 42 (e.g., the non-metallic coating 80 may also be applied over the flexible circuit board 34 after the flexible circuit board 34 is secured to the insulating member 42. Examples of coatings may include Parylene®, Teflon®, epoxy, or any combinations thereof.

Once the insulating member 42 and the flexible circuit 34 are mechanically coupled (e.g., soldering), the bounded opening 62 and/or the slot 56 may be completely or at least partially filled with the underfiller encapsulant 72. The underfiller encapsulant 72 may fill gaps by capillary action, which minimizes voids and stops filling once underfiller encapsulant 72 reaches the outer edges of the flexible circuit board 34 and the insulating member 42. The underfiller encapsulant 72 may be cured to harden and strengthen, for example, curing may comprise heating the underfiller encapsulant 72 to a temperature of about 90° C. to about 200° C. As shown in FIGS. 4 and 5, the underfiller encapsulant 72 may flow around the connected electrical terminals 54a, 54b, 54c, 54d, 54e, 60a, 60b, 60c, 60d, and 60e. The solder joints 70a, 70b, 70c, 70d, and 70e may prevent the underfiller encapsulant 72 from flowing in-between the corresponding electrical terminals 54a, 54b, 54c, 54d, 54e, 60a, 60b, 60c, 60d, and 60e, which may obstruct a sufficient mechanical and/or electrical connection. Furthermore, the underfiller encapsulant 72 may offer support (e.g., provide strain relief) for the solder joint pads 70a, 70b, 70c, 70d, and 70e, which may prevent premature failure of the mechanical and/or electrical connection between the insulating member 42 and the flexible circuit 34.

The underfiller encapsulant may not only provide for a water tight seal, but also provide mechanical support around the electrical connection (e.g., strain relief) to prevent premature failure of the physical and/or electrical connection between the flexible circuit board 34 an the insulating member 42. Accordingly, the underfiller encapsulant may surround each of the electrical terminals 54a, 54b, 54c, 54d and 54e and each of the electrical terminals 60a, 60b, 60c, 60d, and 60e. It is understood that there may be more than one bounded opening 62 and/or slot 56 depending on the spacing of the electrical terminals 54a, 54b, 54c, 54d and 54e and other factors, such as the viscosity of the underfiller encapsulant. It is also understood the bounded opening 62 and/or slot 56 may include any shape to allow proper filling. In certain embodiments, the underfiller encapsulant 72 may be applied from the outer edge 58 of the flexible printed circuit board 34.

The underfiller encapsulant may be a liquid with a viscosity of about 1 to about 100 mPas at 25 degrees Celsius that cures or hardens during the assembly process. For example, underfiller encapsulant may be thermally curable, radiation curable (e.g., light or ultraviolet), a thermoset, a thermoplastic, or curing may be initiated by adding a second component before or during dispensing. The underfiller encapsulant 72 may also be cured by heating the underfiller encapsulant 72 during dispensing to a first temperature and then heating the underfiller encapsulant to a second temperature after dispensing that is greater than the first temperature. In certain embodiments, the underfiller encapsulant may be opaque or colored to aid in inspection of the seal created by the underfiller encapsulant 72. The underfiller encapsulant may have a sufficient glass transition temperature so it does not deform or weaken from exposure to the temperature created when the heating element 16 is powered.

Combinations

A. A heating element (16) for shaving razor (10) comprising:
an insulating member (42) having a base (74) and at least one electrical terminal (60a, 60b, 60c, 60d and 60e);
a flexible printed circuit board (34) having a base (76) with at least one electrical terminal (54a, 54b, 54c, 54d and 54e) electrically and mechanically coupled to the corresponding electrical terminal (60a, 60b, 60c, 60d and 60e) of the insulating member (42);
a non electrically conductive underfiller encapsulant (72) between the base (74) of the insulating member (42) and the base (76) of the flexible printed circuit board (34), wherein the underfiller encapsulant (72) provides a water tight seal around the electrical terminals.

B. The heating element (16) of Paragraph A wherein the flexible printed circuit board (34) defines a thru opening (62) for receiving the underfiller encapsulant (72).

C. The heating element (16) of Paragraph B wherein the thru opening (62) is a bounded hole.

D. The heating element (16) according to any one of Paragraphs A-C wherein the thru opening (62) is positioned between a pair of spaced apart electrical terminals (54a and 54b) on the printed circuit board.

E. The heating element (16) of Paragraph A wherein the flexible printed circuit board (34) defines a slot (56) that receives the underfiller encapsulant (72).

F. The heating element (16) of Paragraph A, wherein the slot (56) extends from an edge (58) of the flexible printed circuit board (34).

G. The heating element (16) according to any one of Paragraphs A-F wherein the underfiller encapsulant (72) is a thermal curing encapsulant.

H. The heating element (16) according to any one of Paragraphs A-G wherein the base (76) of the flexible printed circuit board (34) is spaced apart from the base (74) of the insulating member (42) by 10 μm to 300 μm.

I. The heating element (16) according to any one of Paragraphs A-H wherein the insulating member (42) comprises a heater track (48).

J. The heating element (16) according to any one of Paragraphs A-I wherein the insulating member (42) comprises an electrical track (50) having at least one thermal sensor (52a, 52b).

K. The heating element (16) according to any one of Paragraphs A-J further comprising a non electrically conducting coating (80) on the insulating member (42).

L. The heating element (16) according to any one of Paragraphs A-K wherein the underfiller encapsulant (72) bonds to the insulating member (42) and the flexible circuit board (34).

M. The heating element (16) according to any one of Paragraphs A-L wherein the underfiller encapsulant (72) is colored or opaque.

N. The heating element (16) according to any one of Paragraphs A-M wherein the insulating member (42) comprises a ceramic.

O. The heating element (16) according to any one of Paragraphs A-N further comprising a solder pad joint (70a, 70b, 70c, 70d and 70e) between at least one of the electrical terminals (54a, 54b, 54c, 54d and 54e) of the flexible printed circuit board (34) and at least one of the electrical terminals (60a, 60b, 60c, 60d and 60e) of the insulating member (42).

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm".

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A heating element for a shaving razor comprising:
   an insulating member having a base and at least one electrical terminal;
   a flexible printed circuit board having a base with at least one electrical terminal electrically and mechanically coupled to the corresponding electrical terminal of the insulating member;
   a non electrically conductive underfiller encapsulant between the base of the insulating member and the base of the flexible printed circuit board, wherein the underfiller encapsulant provides a water tight seal around the electrical terminals.

2. The heating element of claim 1 wherein the flexible printed circuit board defines a thru opening for receiving the underfiller encapsulant.

3. The heating element of claim 2 wherein the thru opening is a bounded hole.

4. The heating element of claim 1 wherein the thru opening is positioned between a pair of spaced apart electrical terminals on the printed circuit board.

5. The heating element of claim 1 wherein the flexible printed circuit board defines a slot to receive the underfiller encapsulant.

6. The heating element of claim 5 wherein the slot extends from an edge of the flexible printed circuit board.

7. The heating element of claim 1 wherein the underfiller encapsulant is a thermal curing encapsulant.

8. The heating element of claim 1 wherein the base of the flexible printed circuit board is spaced apart from the base of the insulating member by 10 μm to 300 μm.

9. The heating element of claim 1 wherein the insulating member comprises a heater track.

10. The heating element of claim 1 wherein the insulating member comprises an electrical track having at least one thermal sensor.

11. A heating element for a shaving razor comprising:
    an insulating member having a base and at least one electrical terminal;
    a flexible printed circuit board having a base with at least one electrical terminal electrically and mechanically coupled to the corresponding electrical terminal of the insulating member;
    a non electrically conductive underfiller encapsulant between the base of the insulating member and the base of the flexible printed circuit board, wherein the underfiller encapsulant bonds to the insulating member and the flexible circuit board to provide a water tight seal around the electrical terminals.

12. The heating element of claim 11 further comprising a non electrically conducting coating on the insulating member.

13. The heating element of claim 11 wherein the underfiller encapsulant is colored or opaque.

14. The heating element of claim 11 wherein the insulating member comprises a ceramic.

15. The heating of claim 11 further comprising a solder pad joint between at least one of the electrical terminals of the flexible printed circuit board and at least one of the electrical terminals of the insulating member.

16. The heating element of claim 11 wherein the thru opening is a bounded hole.

17. The heating element of claim 11 wherein the flexible printed circuit board defines a slot to receive the underfiller encapsulant.

18. The heating element of claim 17 wherein the slot extends from an edge of the flexible printed circuit board.

19. A shaving razor system comprising:
    a handle;
    a shaving razor cartridge mounted to the handle;
    a heating element mounted to the shaving razor cartridge, the heating element comprising:
    an insulating member having a base and at least one electrical terminal;
    a flexible printed circuit board having a base with at least one electrical terminal electrically and mechanically coupled to the corresponding electrical terminal of the insulating member;
    a non electrically conductive underfiller encapsulant between the base of the insulating member and the base of the flexible printed circuit board, wherein the underfiller encapsulant provides a water tight seal around the electrical terminals.

20. The shaving razor system of claim 19 wherein the insulating member comprises at least one of a heater track or an electrical track with at least one thermal sensor.

* * * * *